US012813131B2

(12) United States Patent
Xia

(10) Patent No.: US 12,813,131 B2
(45) Date of Patent: Nov. 24, 2026

(54) DISPLAY DEVICE WITH SUPPORTING FRAME HAVING ACCOMMODATING CAVITY

(71) Applicant: SHENZHEN CHINA STAR OPTOELECTRONICS SEMICONDUCTOR DISPLAY TECHNOLOGY CO., LTD., Shenzhen (CN)

(72) Inventor: Rong Xia, Shenzhen (CN)

(73) Assignee: SHENZHEN CHINA STAR OPTOELECTRONICS SEMICONDUCTOR DISPLAY TEHNOLOGY CO., LTD., Shenzhen (CN)

( * ) Notice: Subject to any disclaimer, the term of this patent is extended or adjusted under 35 U.S.C. 154(b) by 420 days.

(21) Appl. No.: 18/565,403

(22) PCT Filed: Aug. 24, 2023

(86) PCT No.: PCT/CN2023/114727
§ 371 (c)(1),
(2) Date: Nov. 29, 2023

(87) PCT Pub. No.: WO2025/010798
PCT Pub. Date: Jan. 16, 2025

(65) Prior Publication Data
US 2025/0024732 A1 Jan. 16, 2025

(30) Foreign Application Priority Data
Jul. 12, 2023 (CN) ........................ 202310849114.2

(51) Int. Cl.
*H10K 59/80* (2023.01)
*H10K 102/00* (2023.01)

(52) U.S. Cl.
CPC ..... *H10K 59/872* (2023.02); *H10K 2102/311* (2023.02)

(58) Field of Classification Search
CPC ....................... H10K 59/872; H10K 2102/311
See application file for complete search history.

(56) References Cited

FOREIGN PATENT DOCUMENTS

| | | | |
|---|---|---|---|
| CN | 202880152 U | * | 4/2013 |
| CN | 104680940 A | | 6/2015 |
| CN | 205899261 U | | 1/2017 |

(Continued)

OTHER PUBLICATIONS

English translation of CN-202880152-U (Year: 2013).*
(Continued)

*Primary Examiner* — Lex H Malsawma
(74) *Attorney, Agent, or Firm* — HSML P.C.

(57) ABSTRACT

A display device includes a supporting frame body having a first accommodating cavity. An end of a first display part of a display assembly is rotationally connected to the supporting frame body, and another end is connected to a second display part. In a first state, the first display part and the second display part are accommodated in a first accommodating cavity. In a second state, the first display part and the second display part are outside the first accommodating cavity. An included angle between the second display part and the first display part ranges from 0° to 180°.

20 Claims, 5 Drawing Sheets

(56) References Cited

FOREIGN PATENT DOCUMENTS

| | | | | | |
|---|---|---|---|---|---|
| CN | 106601129 B | * | 2/2019 | ............ | G09F 9/301 |
| CN | 109922181 A | | 6/2019 | | |
| CN | 111047988 A | | 4/2020 | | |
| CN | 212749556 U | | 3/2021 | | |
| CN | 213457670 U | | 6/2021 | | |
| CN | 215376800 U | * | 12/2021 | | |
| CN | 218720005 U | * | 3/2023 | | |
| CN | 116346970 A | | 6/2023 | | |
| CN | 116564197 A | | 8/2023 | | |
| KR | 20180131143 A | | 12/2018 | | |
| KR | 20210043327 A | | 4/2021 | | |
| WO | 2022262123 A1 | | 12/2022 | | |

OTHER PUBLICATIONS

English translation of CN-106601129-B (Year: 2019).*
English translation of CN-215376800-U (Year: 2021).*
English translation of CN-218720005-U (Year: 2023).*
Chinese Office Action issued in corresponding Chinese Patent Application No. 202310849114.2 dated Aug. 15, 2023, with machine translation, 24 pages provided.
Chinese Office Action issued in corresponding Chinese Patent Application No. 202310849114.2 dated Sep. 1, 2023, with machine translation, 22 pages provided.
International Search Report in International application No. PCT/CN2023/114727, mailed on Jan. 23, 2024, with machine translation, 11 pages provided.
Written Opinion of the International Search Authority in International application No. PCT/CN2023/114727, mailed on Jan. 23, 2024, 9 pages provided.

* cited by examiner

DISPLAY DEVICE WITH SUPPORTING FRAME HAVING ACCOMMODATING CAVITY

CROSS-REFERENCE TO RELATED APPLICATIONS

This application is a continuation of International Application No. PCT/CN2023/114727, filed on Aug. 24, 2023, which claims priority to and the benefit of Chinese Patent Application No. 202310849114.2, filed on Jul. 12, 2023. The disclosures of the aforementioned applications are incorporated herein by reference in their entireties.

TECHNICAL FIELD

The present disclosure relates to a technical field of display, and in particular to a display device.

BACKGROUND

Organic light-emitting diode (OLED) flexible screens have characteristics such as flexibility, light and thin materials, and energy saving. With a development of the OLED flexible screen technology, the OLED flexible screens have become a mainstream of future screen displays.

There are two main product form schemes of the OLED flexible screens including folding and curling, which aim to reduce or restore a volume or an area of products by folding and curling, so as to achieve a goal of making the products portable.

However, at present, there are few ways to store and unfold the OLED flexible screens.

SUMMARY

A display device is provided by embodiments of the present disclosure to store and unfold of multi-segment display parts, thereby enhancing a diversification of display functions of the display device, and realizing different display areas and display angles.

The embodiments of the present disclosure provide a display panel, including:

a supporting frame body, provided with a first accommodating cavity;

a display assembly, including a first display part and a second display part, a side of the first display part is rotationally connected to the supporting frame body, and another side is connected to the second display part;

the display device switches between a first state and a second state; in the first state, the second display part bends at one side of the first display part to be accommodated in the first accommodating cavity with the first display part;

in the second state, the first display part and the second display part rotate relative to the supporting frame body to be outside the first accommodating cavity, and an included angle between the second display part and the first display part ranges from 0° to 180°.

In one embodiment of the present disclosure, the first display part includes a first supporting plate rotationally connected to the supporting frame body and a first display screen body connected to the first supporting plate, and the second display part includes a second supporting plate connected to the first supporting plate and a second display screen body connected to the second supporting plate.

In one embodiment of the present disclosure, a side of the first supporting plate is rotationally connected to the supporting frame body, and another side opposite to the side of the first supporting plate is rotationally connected to the second supporting plate; the first display screen body is slidably connected to the first supporting plate, and the second display screen body is fixedly connected to the second supporting plate.

In one embodiment of the present disclosure, the first display part further includes an intermediate sliding member slidably connected to the first supporting plate and fixedly connected to the first display screen body.

In one embodiment of the present disclosure, the supporting frame body is provided with an opening communicating with the first accommodating cavity;

in the first state, the second display part is located on a side of the first display part away from the opening, the first display screen body is located at a side of the first supporting plate away from the second display part and located at the opening, and the second display screen body is located on a side of the second supporting plate away from the first display part.

In one embodiment of the present disclosure, the display device further includes a functional cover plate rotationally connected to the supporting frame body and located at a joint of the first supporting plate and the supporting frame body; the functional cover plate is located on a side of the first supporting plate away from a bottom of the first accommodating cavity in the first state.

In one embodiment of the present disclosure, the first display screen body is connected to the second display screen body, in the second state, when the included angle between the second display part and the first display part is greater than 0°, the first display screen body slides relative to the first supporting plate, and partially overlaps with the functional cover plate.

In one embodiment of the present disclosure, the display device further includes a transparent cover plate rotationally connected to the supporting frame body; the transparent cover plate is located on a side of the display assembly away from a bottom of the first accommodating cavity in the first state.

In one embodiment of the present disclosure, the display device further includes a second accommodating cavity located at a side of the first accommodating cavity and an audio assembly disposed in the second accommodating cavity.

In one embodiment of the present disclosure, the display device further includes a first rotating member connected between the first display part and the supporting frame body and a second rotating member connected between the first display part and the second display part.

In one embodiment of the present disclosure, the first rotating member includes a first rotating shaft connected between the first display part and the supporting frame body and a first driving member connected to the first rotating shaft, and the second rotating member includes a second rotating shaft connected between the first display part and the second display part and a second driving member connected to the second rotating shaft.

In one embodiment of the present disclosure, the display assembly further includes a third display part rotationally connected to the first display part, and the third display part and the second display part are respectively connected to different sides of the first display part;

in the first state, the third display part bends at one side of the first display part to be accommodated in the first accommodating cavity;

in the second state, the third display part rotates relative to the supporting frame body to be outside the first accommodating cavity, and an included angle between the third display part and the first display part ranges from 0° to 180°.

In one embodiment of the present disclosure, the display assembly further includes a fourth display part rotationally connected to the second display part, and the fourth display part and the first display part are respectively connected to different sides of the second display part;

in the first state, the fourth display part bends at one side of the first display part to be accommodated in the first accommodating cavity;

in the second state, the fourth display part rotates relative to the supporting frame body to be outside the first accommodating cavity, and an included angle between the fourth display part and the second display part ranges from 0° to 180°.

According to the above objects of the present disclosure, the present disclosure provides a display device, including:

a supporting frame body, provided with a first accommodating cavity;

a display assembly, including a first display part and a second display part, a side of the first display part is rotationally connected to the supporting frame body, and another side is connected to the second display part;

the display device switches between a first state and a second state, in the first state, the second display part bends at one side of the first display part to be accommodated in the first accommodating cavity with the first display part;

in the second state, the first display part and the second display part rotate relative to the supporting frame body to be outside the first accommodating cavity, and an included angle between the second display part and the first display part ranges from 0° to 180°;

the first display part includes a first supporting plate rotationally connected to the supporting frame body and a first display screen body connected to the first supporting plate, and the second display part includes a second supporting plate connected to the first supporting plate and a second display screen body connected to the second supporting plate.

In one embodiment of the present disclosure, a side of the first supporting plate is rotationally connected to the supporting frame body, and another side opposite to the side of the first supporting plate is rotationally connected to the second supporting plate; the first display screen body is slidably connected to the first supporting plate, and the second display screen body is fixedly connected to the second supporting plate.

In one embodiment of the present disclosure, the first display part further includes an intermediate sliding member slidably connected to the first supporting plate and fixedly connected to the first display screen body.

In one embodiment of the present disclosure, the supporting frame body is provided with an opening communicating with the first accommodating cavity;

in the first state, the second display part is located on a side of the first display part away from the opening, the first display screen body is located at a side of the first supporting plate away from the second display part and located at the opening, and the second display screen body is located on a side of the second supporting plate away from the first display part.

In one embodiment of the present disclosure, the display device further includes a functional cover plate rotationally connected to the supporting frame body and located at a joint of the first supporting plate and the supporting frame body; the functional cover plate is located on a side of the first supporting plate away from a bottom of the first accommodating cavity in the first state.

In one embodiment of the present disclosure, the first display screen body is connected to the second display screen body, in the second state, when the included angle between the second display part and the first display part is greater than 0 degree, the first display screen body slides relative to the first supporting plate, and partially overlaps the functional cover plate.

In one embodiment of the present disclosure, the display device further includes a transparent cover plate rotationally connected to the supporting frame body; the transparent cover plate is located on a side of the display assembly away from a bottom of the first accommodating cavity in the first state.

Beneficial Effects

In the present disclosure, by dividing the display assembly into at least the first display part and the second display part connected, and the first display part is further rotationally connected to the supporting frame body, so that the display device may switch between the first state and the second state through a rotation of the first display part and the second display part relative to the supporting frame body. That is, in the first state, the first display part and the second display part are folded to be accommodated in the first accommodating cavity. In the second state, the first display part and the second display part are rotated outside the first accommodating cavity. A preset included angle may be between the second display part and the first display part according to requirements to form different display areas and display scenes with different angles. Functions of multi-stage rotation storage and unfolding of display parts in the display assembly may be realized to enhance diversification of the display functions of the display device, and a switching function between a small-size display and a large-size display of the display device may further be realized.

BRIEF DESCRIPTION OF THE DRAWINGS

The technical solutions, as well as other beneficial advantages, of the present disclosure will be apparent from the following detailed descriptions of embodiments of the present disclosure, with reference to attached drawings.

DETAILED DESCRIPTION

Figure 1:
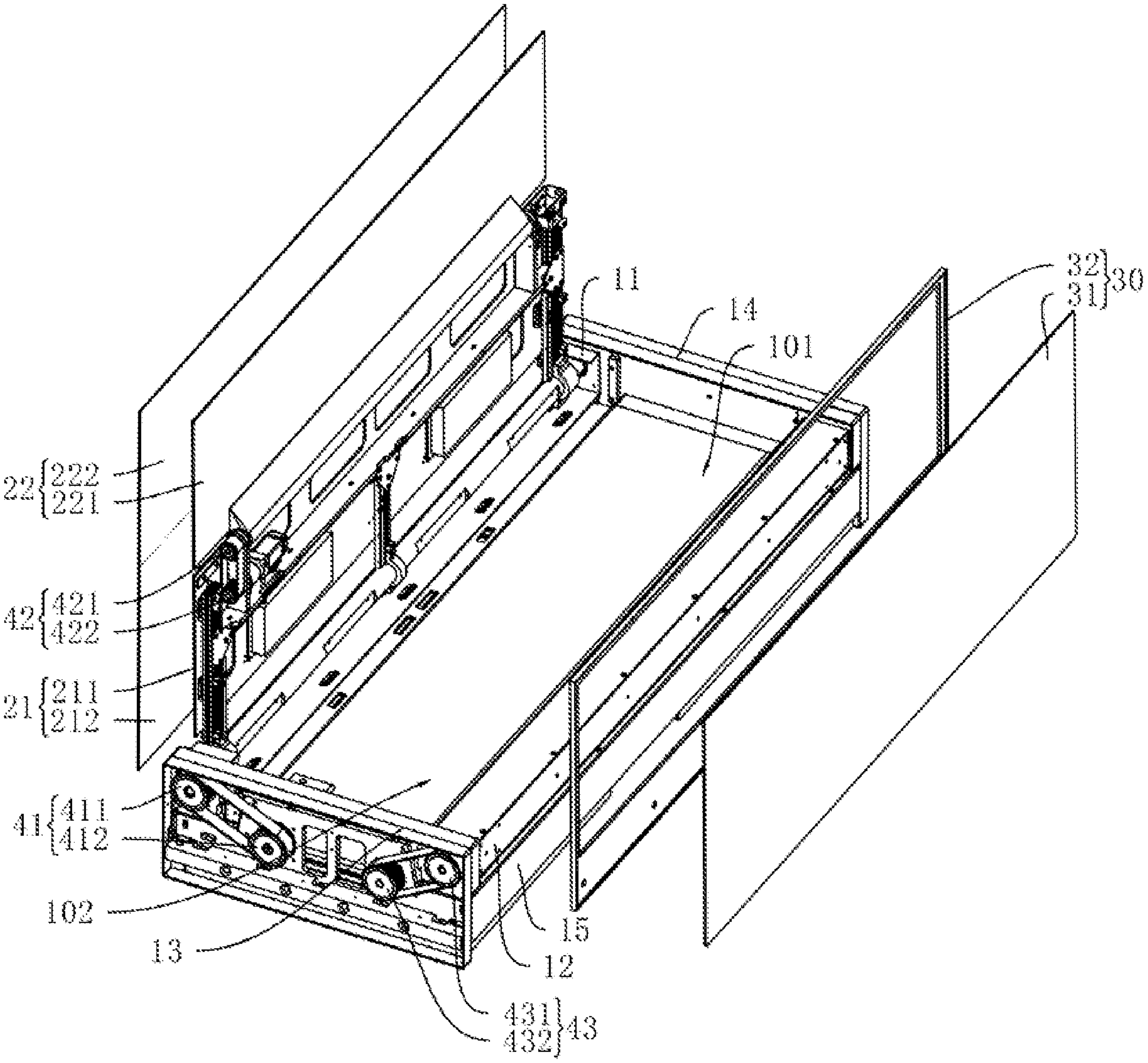
FIG. 1 is a decomposed structural schematic diagram of a display device provided by embodiments of the present disclosure.

The technical solutions in embodiments of the present disclosure will be described clearly and completely hereafter with reference to accompanying drawings. Apparently, the described embodiments are only a part of but not all embodiments of the present disclosure. All other embodiments obtained by persons of ordinary skill in the art based on the embodiments of the present disclosure without creative efforts shall fall within a protection scope of the present disclosure.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the object of simplification and clarity and does not refer to relations between different embodiments and/or settings. Furthermore, examples of different processes and materials are provided in the present disclosure. However, it would be appreciated by those skilled in the art that other processes and/or materials may be also applied.

Referring to FIG. 1, the embodiments of the present disclosure provide a display device including a supporting frame body and a display assembly.

The supporting frame body is provided with a first accommodating cavity 101. The supporting frame body includes a first display part 21 and a second display part 22. One side of the first display part 21 is rotationally connected to the supporting frame body, and another side is connected to the second display part 22.

Furthermore, the display device switches between a first state and a second state. In the first state, the second display part 22 bends at one side of the first display part 21, and the first display part 21 and the second display part 22 are accommodated in the first accommodating cavity 101.

In the second state, the first display part 21 and the second display part 22 rotate relative to the supporting frame body to be outside the first accommodating cavity 101. An included angle between the second display part 22 and the first display part 21 ranges from 0° to 180°.

During implementation and application processes, in the embodiments of the present disclosure, by dividing the display assembly into at least the first display part 21 and the second display part 22 connected, and the first display part 21 is further rotationally connected to the supporting frame body, so that the display device may switch between the first state and the second state through a rotation of the first display part 21 and the second display part 22 relative to the supporting frame body. That is, in the first state, the first display part 21 and the second display part 22 are folded to be accommodated in the first accommodating cavity 101. In the second state, the first display part 21 and the second display part 22 are rotated outside the first accommodating cavity 101. A preset included angle may be between the second display part 22 and the first display part 21 according to requirements to form different display areas and display scenes with different angles. Functions of multi-stage rotation storage and unfolding of display parts in the display assembly may be realized to enhance diversification of the display functions of the display device, and a switching function between a small-size display and a large-size display of the display device may further be realized.

Specifically, continue to refer to FIG. 1, the display device includes the supporting frame body, the display assembly, a transparent cover plate 30, and rotating members.

The supporting frame body is provided with a first accommodating cavity 101. It may be understood that the supporting frame body may be formed by plate bodies surrounded, and the first accommodating cavity 101 is located in an enclosed area of the plate bodies.

In one embodiment, the supporting frame body may include a first plate body 11, a second plate body 12, a third plate body 13, and a fourth plate body 14 connected. The first plate body 11, the second plate body 12, the third plate body 13, and the fourth plate body 14 are connected to surround the first accommodating cavity 101. The first plate body 11 is disposed opposite to the second plate body 12, and the third plate body 13 is disposed opposite to the fourth plate body 14.

The display assembly is rotationally connected to one plate body located at one side of the supporting frame body, and the transparent cover plate 30 is rotationally connected to one plate body located at another side of the supporting frame body.

In one embodiment, the display assembly and the transparent cover plate 30 may be rotationally connected to two plate bodies on opposite sides of the supporting frame body, respectively. For example, the display assembly is rotationally connected to the first plate body 11, and the transparent cover plate 30 is rotationally connected to the second plate body 12.

The supporting frame body may include the first display part 21 and the second display part 22 rotationally connected. One side of the first display part 21 is rotationally connected to the supporting frame body, and another side is connected to the second display part 22.

In the embodiments of the present disclosure, when the first display part 21 rotates relative to the first plate body 11, the second display part 22 may be driven to rotate synchronously relative to the first plate body 11, and further rotate relative to the first display part 21.

Furthermore, when the first display part 21 and the second display part 22 (that is the display assembly) rotate relative to the supporting frame body, the display device may switch between the first state and the second state. When the display device is in the first state, the second display part 22 bends on one side of the first display part 21. That is, one side of the second display part 22 is connected to the first display part 21, another side bends to a back side of the first display part 21, and the second display part 22 and the first display part 21 are folded to be in the first accommodating cavity 101.

Figure 2:
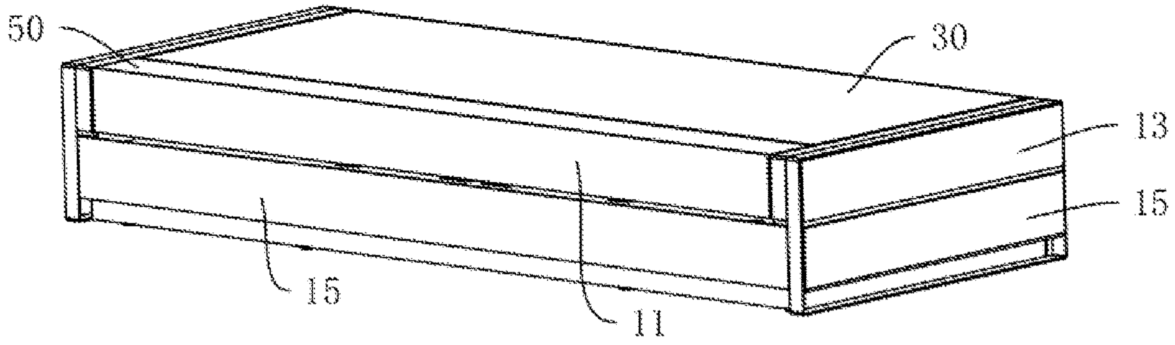
FIG. 2 is a structural schematic diagram of the display panel in a first state provided by the embodiments of the present disclosure.

Referring to FIG. 1 and FIG. 2, the supporting frame body is further provided with an opening 102 communicating with the first accommodating cavity 101. When the display device is in the first state, the transparent cover plate 30 is located at the opening 102, and the display assembly is located at a side of the transparent cover plate 30 away from the opening 102 and accommodated in the first accommodating cavity 101. That is, the transparent cover plate 30 may protect the display assembly accommodated in the first accommodating cavity 101 in the first state.

In one embodiment, when the display device is in the first state, the second display part 22 is located at a side of the first display part 21 away from the transparent cover plate 30. The transparent cover plate 30 may be provided with a touching sensing unit. The display device may further include a calculation control unit connected between the touching sensing unit and the display assembly to perform touch control operations on the display assembly in the first state, thereby realizing interactive functions of the display assembly, such as game interaction and other functions.

In one embodiment, the transparent cover plate 30 includes a frame 32 rotationally connected to the supporting frame body and a transparent cover plate body 31 disposed in the frame 32.

Figure 3:
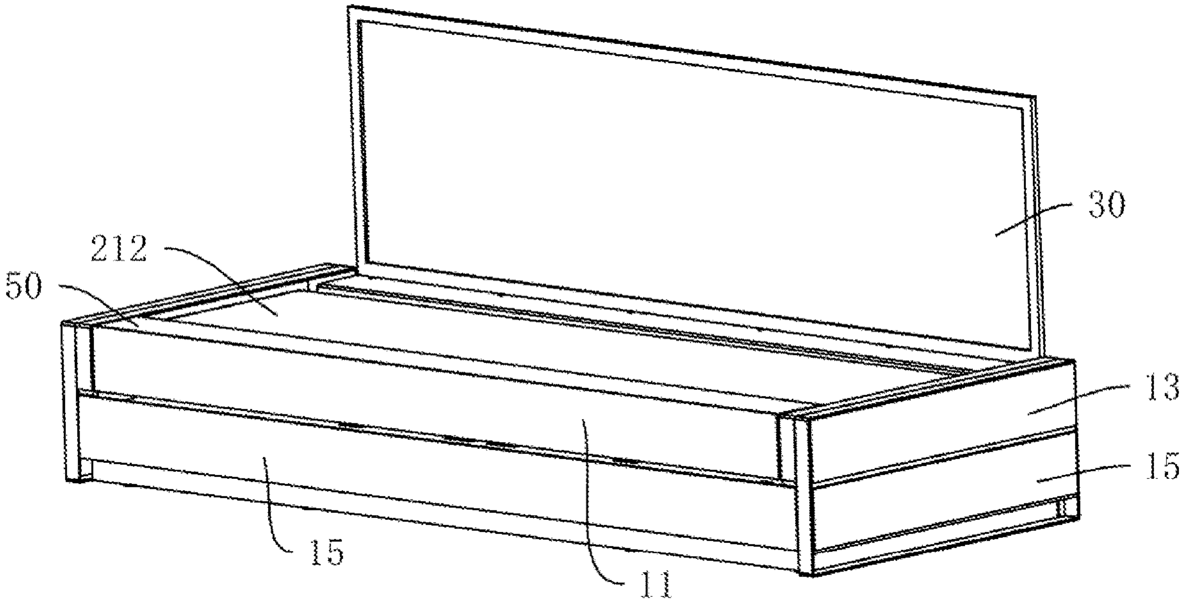
FIG. 3 is a structural schematic diagram of the display panel during a switching process provided by the embodiments of the present disclosure.

Referring to FIG. 1, FIG. 3, FIG. 4, FIG. 5, and FIG. 6, when the display device switches to the second state, the transparent cover plate 30 rotates relative to the second plate body 12 to expose the first accommodating cavity 101 and the display assembly located in the first accommodating cavity 101, as shown in FIG. 3.

Figure 4:
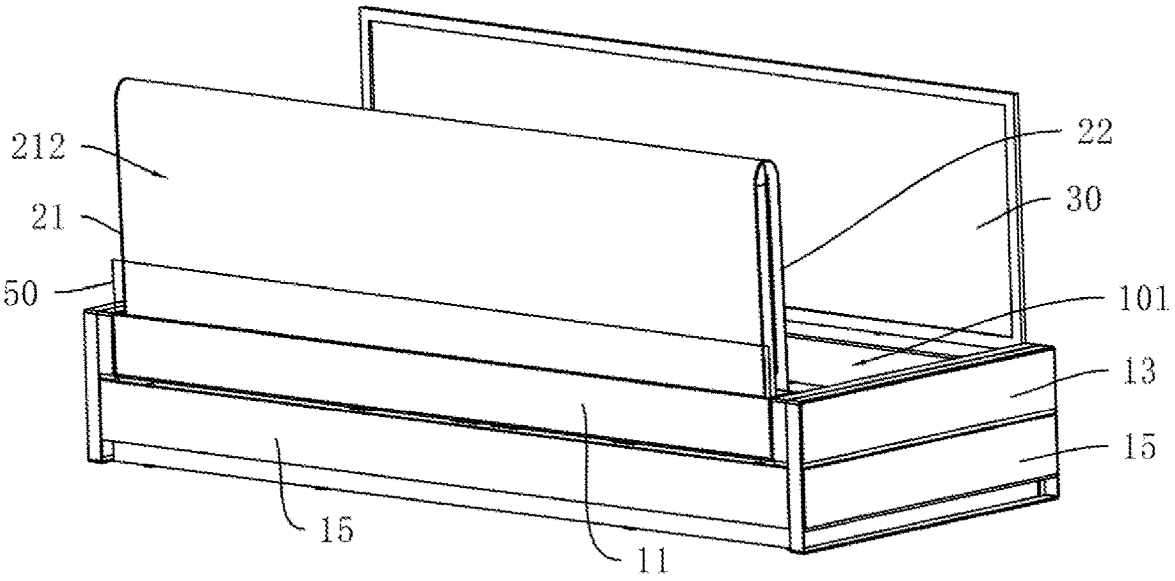
FIG. 4 is another structural schematic diagram of the display panel during the switching process provided by the embodiments of the present disclosure.

Then, the first display part 21 drives the second display part 22 to rotate relative to the first plate 11 to rotate outside the first accommodating cavity 101, as shown in FIG. 4.

In one embodiment, when the first display part 21 and the second display part 22 rotate outside the first accommodating cavity 101, the first display part 21 may be parallel to the first plate body 11. In other embodiments, the included angle between the first display part 21 and the first plate body 11 may be between 90° to 180°, so as to realize display at any angle.

Figure 5:
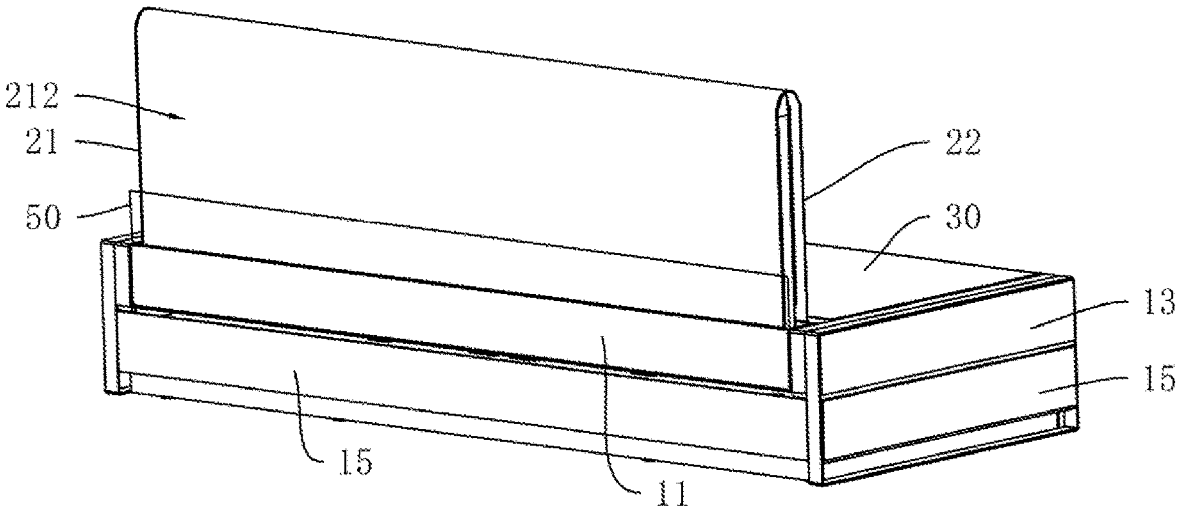
FIG. 5 is a structural schematic diagram of the display panel in a second state provided by the embodiments of the present disclosure.

Next, the transparent cover plate 30 rotates relative to the second plate body 12 again, and rotates to the opening 102 to close the first accommodating cavity 101, as shown in FIG. 5. At this time, the display device has switched to the second state. When the second display part 22 bends at one side of the first display part 21, that is, the included angle between the first display part 21 and the second display part 22 is 0°. At this time, the display device may realize a single-sided display of the first display part 21 or the second display part 22, or a double-sided display of the first display part 21 and the second display part 22.

Figure 6:
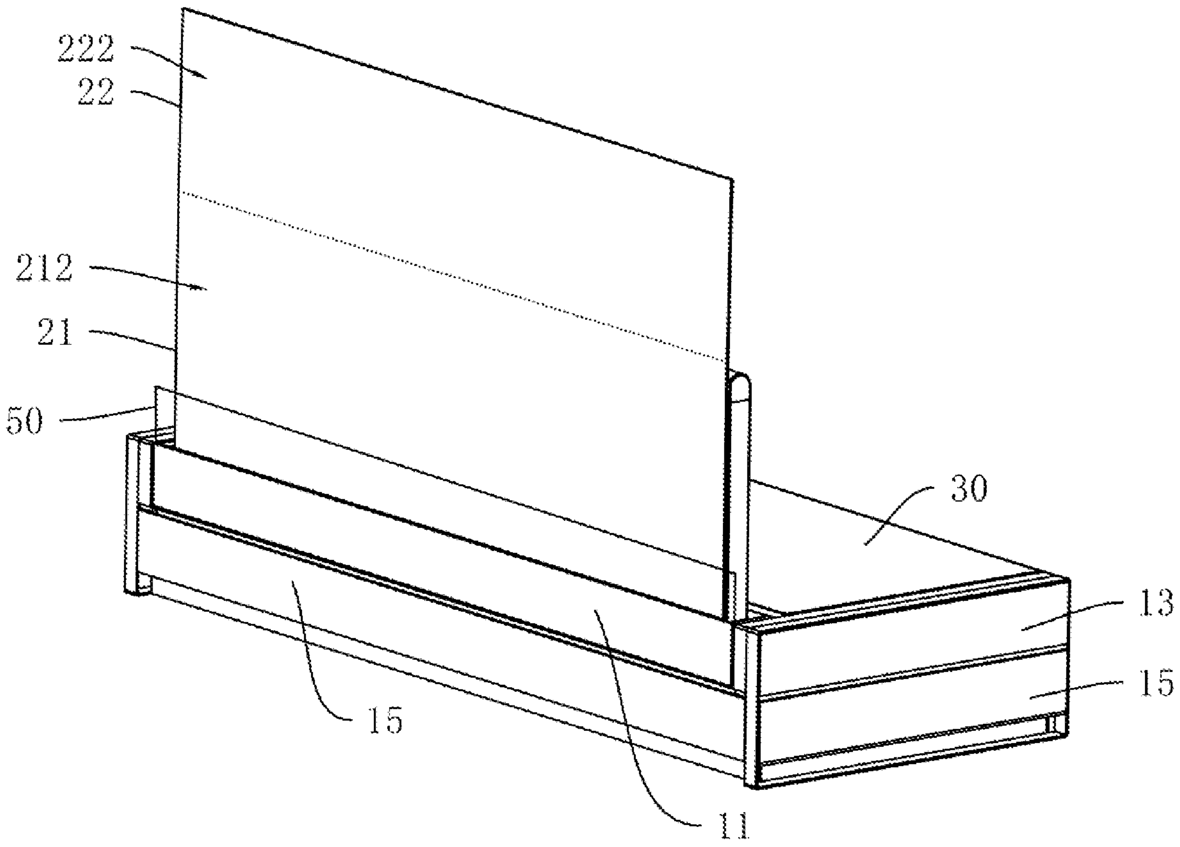
FIG. 6 is another structural schematic diagram of the display panel in the second state provided by the embodiments of the present disclosure.

Furthermore, when the display device is in the second state, the second display part 22 may rotate relative to the first display part 21. That is, the included angle between the second display part 22 and the first display part 21 may range from 0° to 180°, as shown in FIG. 6.

When the included angle between the second display part 22 and the first display part 21 ranges from 0° to 180°, the display of the second display section 22 at different angles may be realized to meet viewing requirements of the display device at different angles.

When the included angle between the second display part 22 and the first display part 21 is 180°, that is, the second display part 22 is coplanar with the first display part 21, thereby realizing a large-size display and meeting the viewing requirements of the display device for large-size display.

It should be noted that the second display part 22 and the supporting frame body need to be connected to different sides of the first display part 21, so that the second display part 22 may rotate to be coplanar with the first display part 21 during the rotation of the second display part 22 relative to the first display part 21 to realize a large-size display screen.

In another embodiment, the first display part 21 and the second display part 22 may be slidably connected. When the display device is in a second state, the second display part 22 may slide relative to the first display part 21, so that the second display part 22 slides out from the back side of the first display part 21 to move out of a shielding range of the first display part 21 and displays together with the first display part 21.

Furthermore, the display device provided by the embodiments of the present disclosure may switch between the large-size display and the small-size display. At the same time, the viewing requirements of different directions and different angles may be met, and an applicability of the display device is improved.

A rotational connection structure between the first display part 21, the second display unit 22, and the supporting frame body of the display device will be described below.

Specifically, the first display part 21 includes a first supporting plate 211 rotationally connected to the supporting frame body and a first display screen body 212 connected to the first supporting plate 211. The second display part 22 includes a second supporting plate 221 rotationally connected to the first supporting plate 211 and a second display screen body 222 connected to the second supporting plate 221.

In one embodiment, one side of the first supporting plate 211 is connected to the first plate body 11, and an opposite side of the first supporting plate 211 is connected to the second supporting plate 221.

It may be understood that, in other embodiments, the second supporting plate 221 may be connected to other sides of the first supporting plate 211 and may not be connected to the same side as the first plate body 11.

In the embodiments of the present disclosure, the second supporting plate 221 and the first plate body 11 are connected to opposite sides of the first supporting plate 211 as an example for explanation.

The first display screen body 212 and the second display screen body 222 are connected. The first display screen body 212 and the second display screen body 222 may be integrally formed. When the included angle between the first display part 21 and the second display screen part 22 is 180°, a flat plate is formed by the first supporting plate 211 and the second supporting plate 221. The first display screen body 212 and the second display screen body 222 are located on the same side of the flat plate.

When the display device is in the first state, the second display part 22 is located on the side of the first display part 21 away from the transparent cover plate 30, that is, away from the opening 102. The first display screen body 212 is located between the first supporting plate 211 and the transparent cover plate 30 to realize the display function of the display device in the first state. The second supporting plate 221 is located on a side of the first supporting plate 211 away from the transparent cover plate 30, and the second display screen body 222 is located on a side of the second supporting plate 221 away from the first supporting plate 211. When the display device is in the second state, and the included angle between the second display part 22 and the first display part 21 is less than 180°, the first display screen body 212 and the second display screen body 222 may face different directions to realize the double-sided display.

Furthermore, the first display screen body 212 is slidably connected to the first supporting plate 211, and the second display screen body 222 is fixedly connected to the second supporting plate 221. Furthermore, when the included angle between the first display part 21 and the second display part 22 is 0°, the first display screen body 212 lays on the first supporting plate 211 and covers a rotational joint of the first supporting plate 211 and the second supporting plate 221. That is, the first display screen body 212 at the rotational joint is in a bent state. When the second display part 22 rotates relative to the first display part 21, that is, when the included angle between the first display part 21 and the second display part 22 is greater than 0°, a part of the first display screen body 212 in the bent state begins to flatten and extends to both sides of the rotational joint of the first supporting plate 211 and the second supporting plate 221. However, since the second display screen body 222 is fixedly connected to the second supporting plate 221, the first display screen body 212 slides relative to the first supporting plate 211 under an action of gravity and towards a side away from the second display screen body 222.

It should be noted that, in the embodiments of the present disclosure, the second display screen body 222 and the second supporting plate 221 are fixedly connected. The first display screen body 212 and the first supporting plate 211 are slidably connected. When the second display part 22 rotates relative to the first display part 21, the part of the first display screen body 212 in the bent state may slide relative to the first supporting plate 211, thereby effectively preventing the first display screen body 212 from being folded, and improving a display effect and a yield of the display device.

In one embodiment, the first display part 21 further includes an intermediate sliding member slidably connected to the first supporting plate 211. The first display screen body 212 is fixedly connected to the intermediate sliding member. The intermediate sliding member may be a slide plate, a slide bar, or other feasible means.

In the embodiments of the present disclosure, the rotating members are connected between the supporting frame body and the first display part 21, between the first display part 21 and the second display part 22, and between the transparent cover plate 30 and the supporting frame body. The rotating members include a first rotating member 41 connected between the first plate body 11 and the first supporting plate 211, a second rotating member 42 connected between the first supporting plate 211 and the second supporting plate 221, and a third rotating member 43 connected between the frame 32 and the second plate body 12.

Specifically, the first rotating member 41 includes a first rotating shaft 411 connected between the first plate body 11 and the first supporting plate 211 and a first driving member 412 connected to the first rotating shaft 411. The second rotating member 42 includes a second rotating shaft 421 connected between the first supporting plate 211 and the second supporting plate 221 and a second driving member 422 connected to the second rotating shaft 421. The third rotating member 43 includes a third rotating shaft 431 connected between the second plate body 12 and the frame 32 and a third driving member 432 connected to the third rotating shaft 431. Each of the first driving member 412, the second driving member 422, and the third driving member 432 may include a motor and drive the first rotating shaft 411, the second rotating shaft 421, and the third rotating shaft 431 respectively through a belt.

In one embodiment, the display device further includes a functional cover plate 50 rotationally connected to the supporting frame body, that is, on the first plate body 11. The functional cover plate 50 is located at a joint of the first supporting plate 211 and the first plate body 11. In the first state, the functional cover plate 50 is located at a side of the first supporting plate 211 away from a bottom of the first accommodating cavity 101, so as to shield the first rotating member 41 at the joint of the first supporting plate 211 and the supporting frame body and structures in the first accommodating cavity 101.

When the display device is in the second state, and the included angle between the second display part 22 and the first display part 21 is greater than 0°, the first display screen body 212 slides relative to the first supporting plate 211, and partially overlaps with the functional cover plate 50. That is, the functional cover plate 50 may further protect an end of the sliding extension of the first display screen body 212.

Optionally, the functional cover plate 50 may be a semi-transparent structure, so as to display when overlapped with the functional cover plate 50.

When the display device is in the first state, the first display screen body 212 may partially overlap with the functional cover plate 50 or may not overlap with the functional cover plate 50.

In addition, the display device further includes a second accommodating cavity and an audio assembly in the second accommodating cavity. The second accommodating cavity is located at one side of the first accommodating cavity 101 to provide sound and other functions for the display device. The second accommodating cavity may be located on a lower side of the first accommodating cavity 101. That is, when the display device is in the first state, the second accommodating cavity is located on a side of the bottom of the first accommodating cavity 101 away from the display assembly.

Optionally, the audio assembly may include devices such as a loudspeaker box and a trumpet.

In one embodiment, referring to FIG. 5, the second accommodating cavity may be formed by four fifth plate bodies 15 surrounded. The first plate body 11, the second plate body 12, the third plate body 13, and the fourth plate body 14 may be correspondingly connected to the fifth plate bodies 15, so that an upper and lower stacked structure is formed by the first accommodating cavity 101 and the second accommodating cavity.

The fifth plate bodies 15 may be provided with one or more openings for sound transmission and heat dissipation.

In other embodiments of the present disclosure, the display assembly may further include a larger number of display parts, and the other display parts may be rotationally connected to the first display part 21 and/or the second display part 22 to realize a larger size display function through state switching.

Specifically, in one embodiment, the display assembly may include a third display part rotationally connected to the first display part 21. The third display part and the second display part 22 are respectively connected to different sides of the first display part 21.

In the first state, the third display part bends at one side of the first display part 21, and the third display part is accommodated in the first accommodating cavity 101. In the second state, when the first display part 21 rotates relative to the supporting frame body, the third display part may be driven to rotate relative to the supporting frame body to be outside the first accommodating cavity 101. An included angle between the third display part and the first display part 21 ranges from 0° to 180°.

It should be noted that a connection way, a rotation way, and a rotation process between the third display unit and the first display unit 21 may be set with reference to the connection way, the rotation way, and the rotation process between the second display part 22 and the first display part 21.

In another embodiment, the display assembly may further include a fourth display part rotationally connected to the second display part 22. The fourth display part and the first display part 21 are respectively connected to different sides of the second display part 22.

In the first state, the fourth display part bends on one side of the second display part 22 and is accommodated in the first accommodating cavity 101. In the second state, when the first display part 21 rotates relative to the supporting frame body, the second display part 22 and the fourth display part may be driven to rotate relative to the supporting frame body to be outside the first accommodating cavity 101. An included angle between the fourth display part and the second display part 22 ranges from 0° to 180°.

It should be noted that a connection way, a rotation way, and a rotation process between the fourth display unit and the second display unit 21 may be set with reference to the connection way, the rotation way, and the rotation process between the second display part 22 and the first display part 21.

Figure 7:
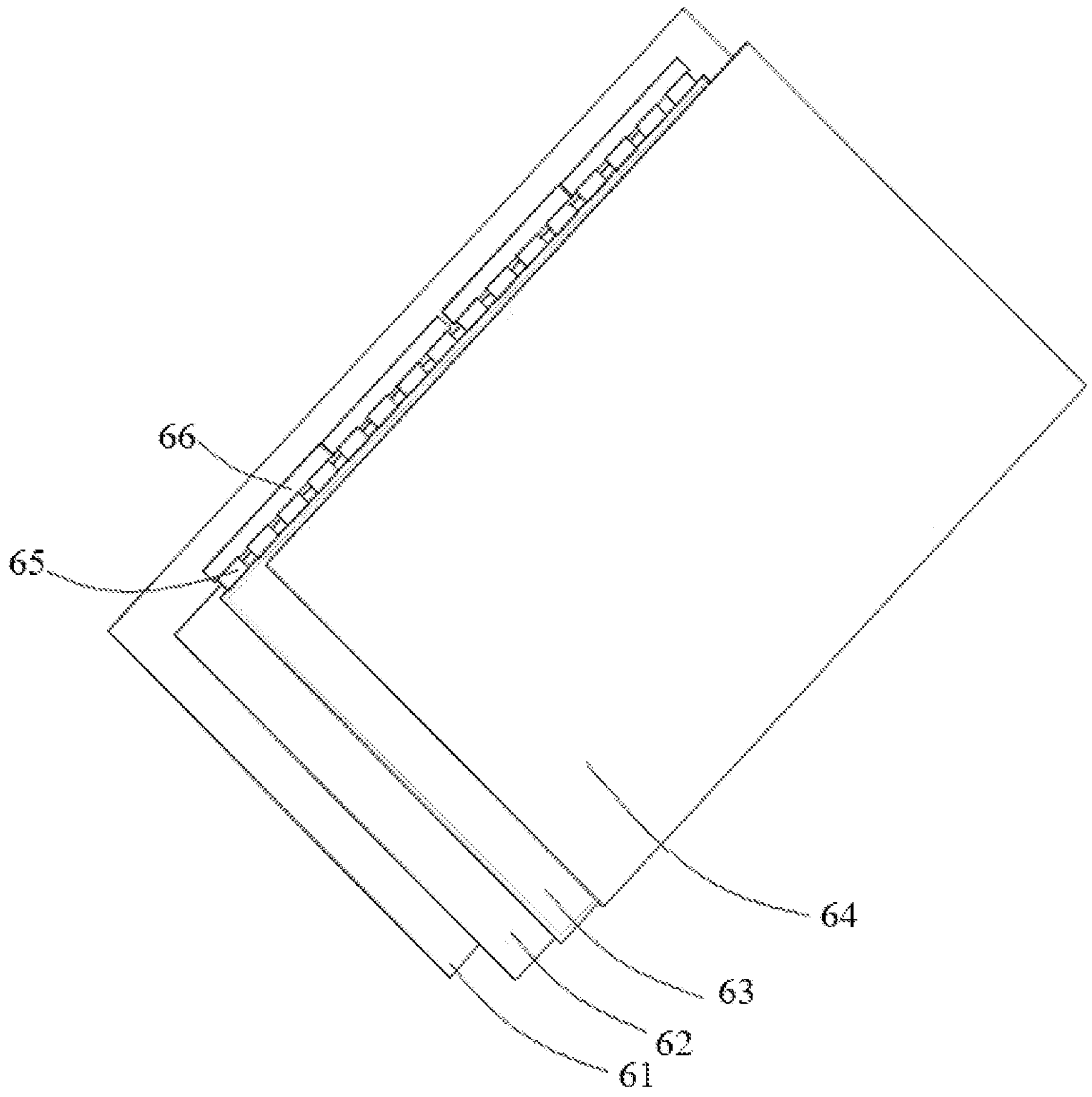
FIG. 7 is a structural schematic diagram of a first display screen body and a second display screen body provided by the embodiments of the present disclosure.

In the embodiments of the present disclosure, the first display screen body 212, the second display screen body 222, and display screen bodies in other possible display parts may all be integrally arranged as a monolithic display screen. Referring to FIG. 7, A display screen includes a supporting layer 61, a substrate layer 62, a display functional layer 63, a polarizer 64, and a circuit board 66 bound to the display functional layer 63 through a flexible circuit board 65 stacked.

The display functional layer 63 may include a thin film transistor array layer and an organic light-emitting diode light-emitting layer arranged stacked with the thin film transistor array layer.

In summary, in the embodiments of the present disclosure, by dividing the display assembly into at least the first display part 21 and the second display part 22 connected, and the first display part 21 is further rotationally connected to the supporting frame body, so that the display device may switch between the first state and the second state through a rotation of the first display part 21 and the second display part 22 relative to the supporting frame body. That is, in the first state, the first display part 21 and the second display part 22 are folded to be accommodated in the first accommodating cavity 101. In the second state, the first display part 21 and the second display part 22 are rotated outside the first accommodating cavity 101. A preset included angle may be between the second display part 22 and the first display part 21 according to requirements to form different display areas and display scenes with different angles. Functions of multi-stage rotation storage and unfolding of display parts in the display assembly may be realized to enhance diversification of the display functions of the display device, and a switching function between a small-size display and a large-size display of the display device may further be realized.

In one embodiment, the display device provided by the embodiments of the present disclosure may include devices such as a television or other desktop display devices.

In the embodiments mentioned above, the description of each of the embodiments has respective focuses. For a part that is not described in detail in an embodiment, reference may be made to relevant descriptions in other embodiments.

The display device provided in the embodiments of the present disclosure are described in detail above. The principle and implementations of the present disclosure are described in this specification by using specific examples. The description about the foregoing embodiments is merely provided to help understand the method and core ideas of the present disclosure. Persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A display device, comprising:

a supporting frame body, provided with a first accommodating cavity;

a display assembly, comprising a first display part and a second display part, wherein a side of the first display part is rotationally connected to the supporting frame body, and another side is connected to the second display part;

wherein the display device switches between a first state and a second state, in the first state, the second display part bends at one side of the first display part to be accommodated in the first accommodating cavity with the first display part;

in the second state, the first display part and the second display part rotate relative to the supporting frame body to be outside the first accommodating cavity, and an included angle between the second display part and the first display part ranges from 0° to 180°;

wherein the first display part comprises a first supporting plate rotationally connected to the supporting frame body and a first display screen body connected to the first supporting plate, the second display part comprises a second supporting plate connected to the first supporting plate and a second display screen body connected to the second supporting plate, and the second display screen body is fixedly connected to the second supporting plate.

2. The display device according to claim 1, wherein a side of the first supporting plate is rotationally connected to the supporting frame body, and another side opposite to the side of the first supporting plate is rotationally connected to the second supporting plate; the first display screen body is slidably connected to the first supporting plate.

3. The display device according to claim 2, wherein the first display part further comprises an intermediate sliding member slidably connected to the first supporting plate and fixedly connected to the first display screen body.

4. The display device according to claim 1, wherein the supporting frame body is provided with an opening communicating with the first accommodating cavity;

in the first state, the second display part is located on a side of the first display part away from the opening, the first display screen body is located at a side of the first supporting plate away from the second display part and located at the opening, and the second display screen body is located on a side of the second supporting plate away from the first display part.

5. The display device according to claim 1, further comprising:

a functional cover plate, rotationally connected to the supporting frame body and located at a joint of the first supporting plate and the supporting frame body;

wherein the functional cover plate is located on a side of the first supporting plate away from a bottom of the first accommodating cavity in the first state.

6. The display device according to claim 5, wherein the first display screen body is connected to the second display screen body; in the second state, when the included angle between the second display part and the first display part is greater than 0°, the first display screen body slides relative to the first supporting plate and partially overlaps with the functional cover plate.

7. The display device according to claim 1, further comprising:

a transparent cover plate, rotationally connected to the supporting frame body;

wherein the transparent cover plate is located on a side of the display assembly away from a bottom of the first accommodating cavity in the first state.

8. The display device according to claim 1, further comprising:

a second accommodating cavity, located at a side of the first accommodating cavity; and an audio assembly, disposed in the second accommodating cavity.

9. The display device according to claim 1, further comprising:

a first rotating member, connected between the first display part and the supporting frame body; and a second rotating member, connected between the first display part and the second display part.

10. The display device according to claim 9, wherein the first rotating member comprises a first rotating shaft connected between the first display part and the supporting frame body and a first driving member connected to the first rotating shaft, and the second rotating member comprises a second rotating shaft connected between the first display part and the second display part and a second driving member connected to the second rotating shaft.

11. The display device according to claim 1, wherein the display assembly further comprises a third display part rotationally connected to the first display part, and the third display part and the second display part are respectively connected to different sides of the first display part;

in the first state, the third display part bends at one side of the first display part to be accommodated in the first accommodating cavity;

in the second state, the third display part rotates relative to the supporting frame body to be outside the first accommodating cavity, and an included angle between the third display part and the first display part ranges from 0° to 180°.

12. The display device according to claim 1, wherein the display assembly further comprises a fourth display part rotationally connected to the second display part, and the fourth display part and the first display part are respectively connected to different sides of the second display part;

in the first state, the fourth display part bends at one side of the first display part to be accommodated in the first accommodating cavity;

in the second state, the fourth display part rotates relative to the supporting frame body to be outside the first accommodating cavity, and an included angle between the fourth display part and the second display part ranges from 0° to 180°.

13. The display device according to claim 1, wherein in a case where the included angle between the first display part and the second display screen part is 180°, a flat plate is formed by the first supporting plate and the second supporting plate, and the first display screen body and the second display screen body are located on a same side of the flat plate.

14. The display device according to claim 1, wherein the first display screen body slides relative to the first supporting plate under an action of gravity and towards a side away from the second display screen body.

15. A display device, comprising:

a supporting frame body, provided with a first accommodating cavity;

a display assembly, comprising a first display part and a second display part, wherein a side of the first display part is rotationally connected to the supporting frame body, and another side is connected to the second display part;

wherein the display device switches between a first state and a second state, in the first state, the second display part bends at one side of the first display part to be accommodated in the first accommodating cavity with the first display part;

in the second state, the first display part and the second display part rotate relative to the supporting frame body to be outside the first accommodating cavity, and an included angle between the second display part and the first display part ranges from 0° to 180°;

the first display part comprises a first supporting plate rotationally connected to the supporting frame body and a first display screen body connected to the first supporting plate, the second display part comprises a second supporting plate connected to the first supporting plate and a second display screen body connected to the second supporting plate, and the second display screen body is fixedly connected to the second supporting plate;

the display device further comprises a first rotating member connected between the first display part and the supporting frame body and a second rotating member connected between the first display part and the second display part.

16. The display device according to claim 15, wherein a side of the first supporting plate is rotationally connected to the supporting frame body, and another side opposite to the side of the first supporting plate is rotationally connected to the second supporting plate; the first display screen body is slidably connected to the first supporting plate.

17. The display device according to claim 16, wherein the first display part further comprises an intermediate sliding member slidably connected to the first supporting plate and fixedly connected to the first display screen body.

18. The display device according to claim 15, wherein the supporting frame body is provided with an opening communicating with the first accommodating cavity;

in the first state, the second display part is located on a side of the first display part away from the opening, the first display screen body is located at a side of the first supporting plate away from the second display part and located at the opening, and the second display screen body is located on a side of the second supporting plate away from the first display part.

19. The display device according to claim 15, further comprising:

a functional cover plate, rotationally connected to the supporting frame body and located at a joint of the first supporting plate and the supporting frame body;

wherein the functional cover plate is located on a side of the first supporting plate away from a bottom of the first accommodating cavity in the first state.

20. The display device according to claim 19, wherein the first display screen body is connected to the second display screen body; in the second state, when the included angle between the second display part and the first display part is greater than 0°, the first display screen body slides relative to the first supporting plate and partially overlaps with the functional cover plate.

* * * * *